United States Patent [19]

Lee

[11] Patent Number: 4,862,017

[45] Date of Patent: Aug. 29, 1989

[54] CURRENT-MIRROR TRANSISTOR LOGIC CIRCUIT

[75] Inventor: Sywe-Neng Lee, Boston, Mass.

[73] Assignee: GTE Laboratories Incorporated, Waltham, Mass.

[21] Appl. No.: 166,331

[22] Filed: Mar. 10, 1988

[51] Int. Cl.[4] .................... H03K 17/16; H03K 19/20; H03K 19/017; H03K 19/094

[52] U.S. Cl. ................................. 307/443; 307/445; 307/448; 307/451

[58] Field of Search ................ 307/443, 445, 448, 451

[56] References Cited

U.S. PATENT DOCUMENTS 4,363,978 12/1982 Heimbigner ........................ 307/445

OTHER PUBLICATIONS

"High Speed CMOS NOR circuit" Research Disclosure, 9/84, No. 245, Kenneth Mason Publications Ltd, England.

Primary Examiner—Stanley D. Miller
Assistant Examiner—Margaret R. Wambach
Attorney, Agent, or Firm—James J. Cannon, Jr.; David M. Keay

[57] ABSTRACT

An n-imput CMOS NOR-gate having n nMOS transistors connected in parallel with their inputs connected to different input terminals and their outputs connected to a common output terminal. First and second sets of n pMOS transistors each are each connected in series between a positive voltage source and the output terminal. The inputs of the first set of pMOS transistors are connected to the input terminals in order, and the inputs of the second set of pMOS transistors are connected to the input terminals in the reverse order.

3 Claims, 2 Drawing Sheets

CURRENT-MIRROR TRANSISTOR LOGIC CIRCUIT

CROSS-REFERENCE TO RELATED APPLICATION

This application is related to application Ser. No. 166,576, filed Mar. 10, 1988, entitled Logic Circuit filed concurrently herewith by Sywe-Neng Lee and assigned to the assignee of the present application.

BACKGROUND OF THE INVENTION

This invention relates to logic circuits. More particularly, it is concerned with logic circuits employing complementary transistors.

Basic logic gates are used extensively in logic circuit design to implement the Boolean Algebra of either combination logic or sequential circuits. Basic logic circuits frequently employ complementary metal-oxide-semiconductor (CMOS) transistors. One widely-used logic gate circuit is the so-called NOR-gate. With previously known CMOS NOR-gates the speed of switching between operating states increases with the number of inputs to the gate. This gate delay becomes significant when the number of inputs to the gate is greater than five. For instance, when a NOR-gate is used as a decoding element of the control section in high speed signal processing and high speed switching applications, the gate delay will affect the entire system throughput becoming a dominant factor in determining the system performance.

One approach for improving the speed-degrading problem of gate delay is to separate the NOR-gate into several NOR-gates, each having only a few inputs, and connecting the outputs of the several NOR-gates to an OR-gate. Such an arrangement, however, increases the number of stages of delay. Another approach is to increase the size of the MOS transistors in order to increase both the charging and the discharging speeds at the output of the gate. Increasing the size of a transistor beyond a certain amount, however, increases the source-drain and the gate capacitances of the transistor thus degrading the charging and discharging speed.

SUMMARY OF THE INVENTION

A logic circuit in accordance with the present invention comprises a plurality of input terminals for receiving input signals at a first or a second logic level, and an output terminal. A like plurality of transistors of one conductivity type are connected in parallel between the output terminal and a point of reference potential. Each transistor has an input connected to one of the input terminals. A first set of a like plurality of transistors of the opposite conductivity type are connected in order in series between a source of operating potential and the output terminal. Each of the transistors of the first set has an input connected to one of the input terminals in order. A second set of a like plurality of transistors of the opposite conductivity type are connected in order in series between the source of operating potential and the output terminal. Each of the transistors of the second set has an input connected to one of the input terminals in a different order from the transistors of the first set.

For a better understanding of the present invention, together with other and further objects, advantages, and capabilities thereof, reference is made to the following disclosure and appended claims in connection with the above-described drawings.

DETAILED DESCRIPTION

Figure 1:
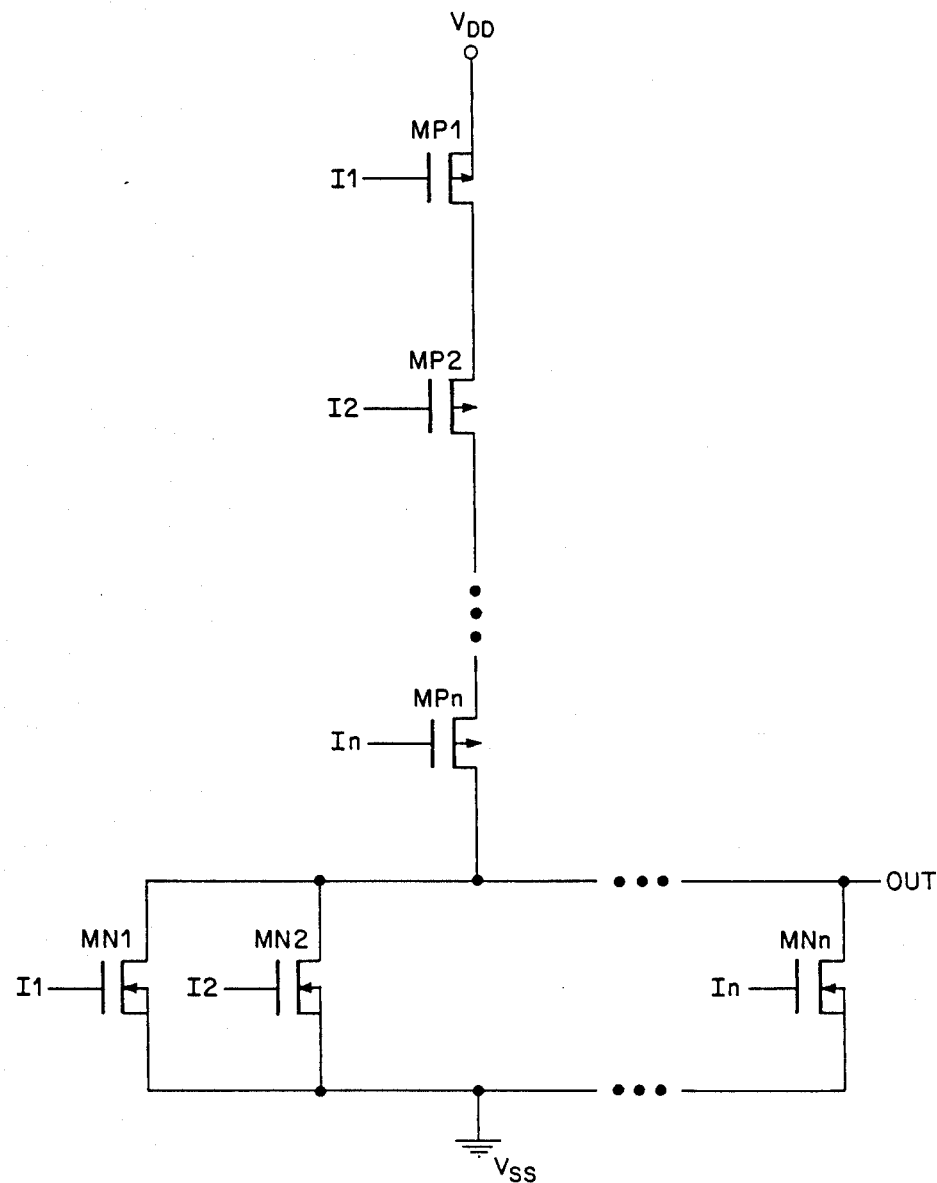
FIG. 1 is a schematic circuit diagram of a CMOS NOR-gate of the prior art.

FIG. 1 is a schematic circuit diagram of a conventional, prior art CMOS NOR-gate. As is well understood, a NOR-gate operates to produce a logic 1 at its output OUT when and only when a logic 0 is present at all of the inputs I1–In. The CMOS NOR-gate as illustrated in FIG. 1 includes a plurality of n nMOS transistors MN1–MNn connected in parallel between an output terminal OUT and a point of reference potential $V_{SS}$ indicated as ground. The gate of each nMOS transistor is connected to a different input terminal I1–In. A like plurality of n complementary pMOS transistors MP1–MPn are connected in series between a source of positive operating voltage $V_{DD}$ and the output terminal OUT. The pMOS transistors MP1–MPn have their gates connected to the input terminals I1–In in order. Thus, each input terminal I1–In is connected to the gates of a pair of CMOS transistors, MN1–MNn, and MP1–MPn, respectively.

The CMOS NOR-gate of FIG. 1 operates in the following manner. Whenever one or more of the input signals at the input terminals I1–In is high, logic 1, the nMOS transistor, or transistors. MN1–MNn having that signal at the input is conducting or turned on. The complementary pMOS transistor MP1–MPn connected to the same input terminal is nonconducting or off. Under these conditions the potential at the output terminal OUT is approximately $V_{SS}$.

When the input signals at all of the input terminals I1–In are low, logic 0, all of the nMOS transistors MN1–MNn are nonconducting or off producing a impedance between $V_{SS}$ and the output terminal OUT. All of the pMOS transistors MP1–MPn are on or conducting and thus the potential at the output terminal OUT is approximately $V_{DD}$.

The "worst case" delay situation occurs when the input signals to the input terminals I2–In are low, logic 0, and the input to the other input terminal I1 changes from high, logic 1, to low, logic 0. While the input signals at input terminals I2–In are low and the input signal at input terminal I1 is high, transistors MN2–MNn are off and transistor MN1 is on, transistors MP2–MPn are on and transistor MP1 is off. Under these conditions the output terminal OUT is discharged through the conducting transistor MN1 to approximately $V_{SS}$. The source-drain regions of the on pMOS transistors are also at the level of $V_{SS}$.

When the input signal at input terminal I1 changes from high, logic 1, to low, logic 0, transistor MN1 turns off and transistor MP1 turns on. In order for the potential at the output terminal OUT to change to the potential $V_{DD}$, all of the output terminal node as well as the source-drain regions of the pMOS transistors MP2–MPn must be charged to the potential $V_{DD}$. The charging path is through transistor MP1, now conducting. The source-drain regions of transistors MP2–MPn must be charged, and in addition charging current must pass through all of the pMOS transistors MP1–MPn in series to the output node. Thus, it can be seen that the charge time or gate delay for a gate degrades rapidly as the number of inputs and consequently the number of transistors in the charge path increases.

Figure 2:
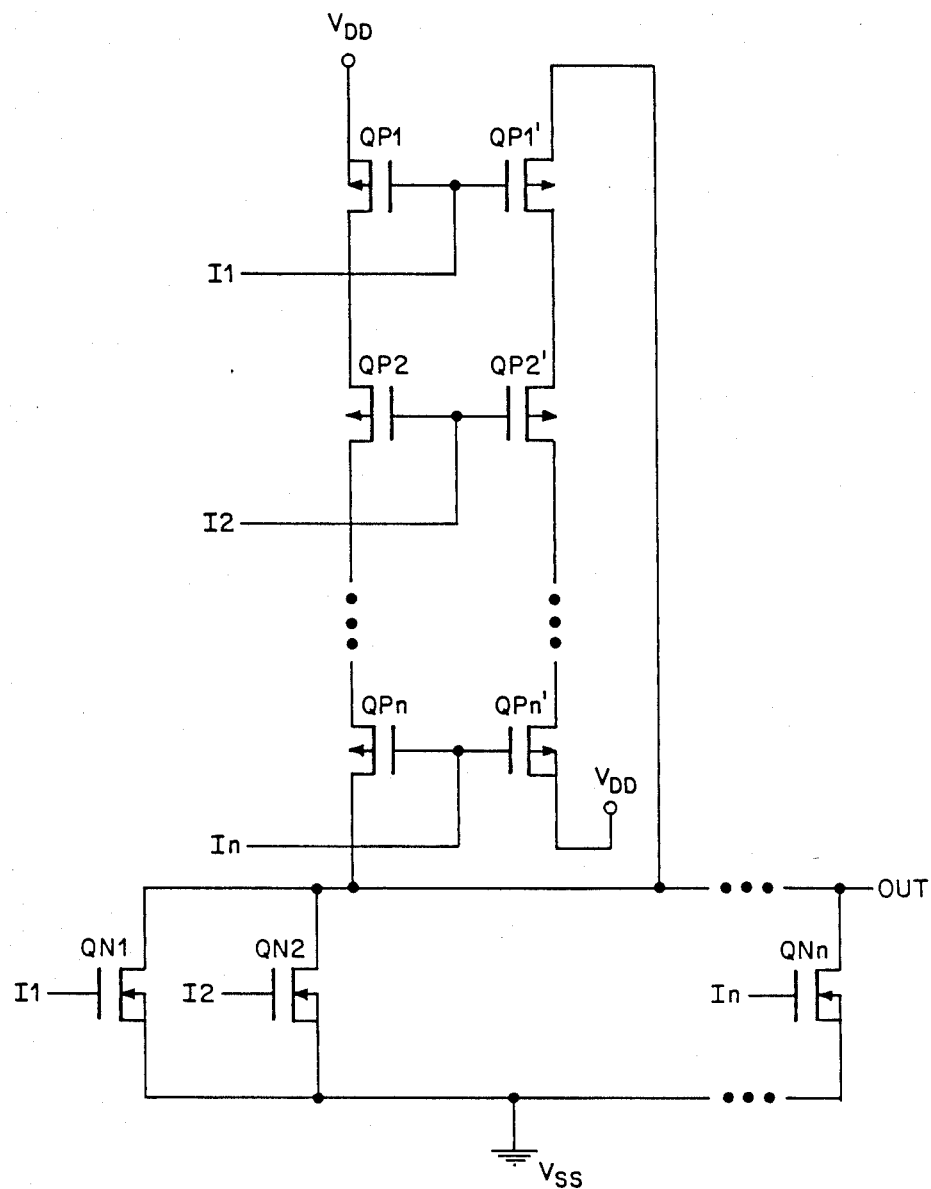
FIG. 2 is a schematic circuit diagram of a CMOS NOR-gate in accordance with the present invention.

FIG. 2 illustrates an improved CMOS NOR-gate in accordance with the present invention. The circuit includes a plurality n of nMOS transistors QN1-QNn connected in parallel between an output terminal OUT and ground $V_{SS}$. The gate of each nMOS transistor QN1-QNn is connected to a different input terminal I1-In. The circuit also includes a first set of a like plurality n of pMOS transistors QP1-QPn connected in series between a source of positive operating potential $V_{DD}$ and the output terminal OUT. Each of the first set of pMOS transistors QP1-QPn has its input electrode connected in order to an input terminal I1-In to form pairs of complementary transistors with the nMOS transistors QN1-QNn.

The circuit of FIG. 2 also includes a second set of a like plurality n of pMOS transistors QP1'-QPn' connected in series between the output terminal OUT and the source of operating potential $V_{DD}$. Alternatively, the transistors QP1'-QPn' of the second set may be considered as connected in reverse order between the voltage source $V_{DD}$ and the output terminal OUT. The inputs of the pMOS transistors QP1'-QPn' of the second set are connected in order to the input terminals I1-In; or if considered in the reverse order from $V_{DD}$ to the output terminal OUT, the inputs are connected to the input terminals in reverse order.

Thus, in the "worst case" situation as discussed hereinabove with respect to the circuit of FIG. 1, when the input signals at input terminals I2-In are low, logic 0, and the input signal at input terminal I1 is high, logic 1, nMOS transistors QN2-QNn are off and nMOS transistor QN1 is on. In addition, pMOS transistors QP2-QPn of the first set and pMOS transistor QP2'-QPn' of the second set are on and pMOS transistors QP1 and QP1' are off. The potential at the output terminal OUT is approximately $V_{SS}$ and the source-drain regions of the on pMOS transistors QP2-QPn of the first set are at the $V_{SS}$ level. In the second set of pMOS transistors, transistor QP1' is off and transistors QP2'-QPn' are biased on. Thus the source-drain regions of transistors QP2'-QPn' are already charged at input terminal I1 changes from high. logic 1, to low, logic 0, turning nMOS transistor QN1 off and turning pMOS transistors QP1 and QP1' on, the output terminal node is charged to $V_{DD}$ through only a signal transistor QP1'. The output node is thus charged to $V_{DD}$ more rapidly than in prior art circuits, thereby providing significantly improved gate delay characteristics particularly for logic gates with a large number of inputs.

While there has been shown and described what is considered a preferred embodiment of the present invention, it will be obvious to those skilled in the art that various changes and modifications may be made therein without departing from the invention as defined by the appended claims.

What is claimed is:

1. A logic circuit comprising
   a plurality of input terminals for receiving input signals at first or a second logic level;
   an output terminal;
   a like plurality of transistors of a first conductivity type connected in parallel between said output terminal and a point of reference potential, and each having an input connected to one of said input terminals,
   a first set of a like plurality of transistors of a second conductivity type connected in series between a source of operating potential and said output terminal, each having an input connected to one of said input terminals; and
   a second set of a like plurality of transistors of said second conductivity type connected in series between said source of operating potential and said output terminal, each having an input connected to one of said input terminals such that each transistor in said first set is paired with transistor in said second set having a like position in said series and both are connected to the same one of said input terminals;
   wherein the first transistor in said series of transistors of said first set is connected to said source of operating potential; and
   wherein the last transistor in said series of transistors of said second set is connected to said source of operating potential;
   wherein said first conductivity type is opposite to said second conductivity type;
   wherein each transistor of said first conductivity type is in a conducting condition in response to an input signal of said first logic level at its input and is in a nonconducting condition in response to an input signal of said second logic level at its input; and
   wherein each transistor of said second conductivity type is in a nonconducting condition in response to an input signal of said first logic level at its input and is in a conducting condition in response to an input signal of said second logic level at its input;
   whereby said output terminal is at the potential of the point of reference potential when input signals of the first logic level are present at one or more of the input terminals, and said output terminal is at the potential of the source of operating potential when input signals of the second logic level are present at all of the input terminals.

2. A logic circuit in accordance with claim 1 wherein
   said transistors of said first conductivity type are N-type; and
   said transistors of said second conductivity type are P-type.

3. A logic circuit in accordance with claim 1 wherein
   said transistors of the first conductivity type are nMOS transistors;
   said transistors of the second conductivity type are pMOS transistors; and
   said source of operating potential is positive with respect to said point of reference potential.

* * * * *